United States Patent
Stahl et al.

(10) Patent No.: US 11,245,251 B2
(45) Date of Patent: Feb. 8, 2022

(54) SPARK PLUG HOUSING INCLUDING AN ELECTROPLATED OR A CHEMICALLY APPLIED NICKEL-CONTAINING PROTECTIVE LAYER AND A SILICON-CONTAINING SEALING LAYER, AND A SPARK PLUG INCLUDING THIS HOUSING, AND METHOD FOR MANUFACTURING THIS HOUSING

(71) Applicant: Robert Bosch GmbH, Stuttgart (DE)

(72) Inventors: Juergen Stahl, Bamberg (DE); Juergen Hackenberg, Sachsenheim (DE); Silvan Hippchen, Sersheim (DE); Tina Hirte, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 17/257,853

(22) PCT Filed: May 31, 2019

(86) PCT No.: PCT/EP2019/064238
§ 371 (c)(1),
(2) Date: Jan. 5, 2021

(87) PCT Pub. No.: WO2020/011445
PCT Pub. Date: Jan. 16, 2020

(65) Prior Publication Data
US 2021/0288473 A1    Sep. 16, 2021

(30) Foreign Application Priority Data

Jul. 9, 2018  (DE) ............... 10 2018 211 303.3
Jul. 9, 2018  (DE) ............... 10 2018 211 306.8
Dec. 21, 2018 (DE) ............... 10 2018 222 838.8

(51) Int. Cl.
*H01T 13/06*  (2006.01)
*H01T 13/08*  (2006.01)
(Continued)

(52) U.S. Cl.
CPC ............. *H01T 13/06* (2013.01); *H01T 13/08* (2013.01); *H01T 13/39* (2013.01); *H01T 21/02* (2013.01)

(58) Field of Classification Search
CPC ................................... H01T 13/06
See application file for complete search history.

(56) References Cited

FOREIGN PATENT DOCUMENTS

DE    10205751 A1    8/2003
DE    60002534 T2    11/2003
(Continued)

OTHER PUBLICATIONS

International Search Report for PCT/EP2019/064238, dated Aug. 20, 2019.

*Primary Examiner* — Vip Patel
(74) *Attorney, Agent, or Firm* — Norton Rose Fulbright US LLP; Gerard Messina (57) ABSTRACT

A housing for a spark plug. The housing includes a bore along the longitudinal axis X of the housing, as the result of which the housing has an outer side and an inner side, and an electroplated or chemically applied nickel-containing protective layer situated on at least one portion of the outer side of the housing and a sealing layer situated on the nickel-containing protective layer. The sealing layer contains silicon. A first intermediate layer is applied between the housing and the nickel-containing protective layer and/or a second intermediate layer is applied between the nickel-containing protective layer and the sealing layer and/or a cover layer is applied on the sealing layer. The sealing layer may be free of chromium.

18 Claims, 4 Drawing Sheets

(51) Int. Cl.
*H01T 13/39* (2006.01)
*H01T 21/02* (2006.01)

(56) References Cited

FOREIGN PATENT DOCUMENTS

| | | |
|---|---|---|
| DE | 10342912 A1 | 4/2005 |
| EP | 1484432 A1 | 12/2004 |
| EP | 2546938 A1 | 1/2013 |
| EP | 2605348 A1 | 6/2013 |
| JP | 2000048930 A | 2/2000 |

SPARK PLUG HOUSING INCLUDING AN ELECTROPLATED OR A CHEMICALLY APPLIED NICKEL-CONTAINING PROTECTIVE LAYER AND A SILICON-CONTAINING SEALING LAYER, AND A SPARK PLUG INCLUDING THIS HOUSING, AND METHOD FOR MANUFACTURING THIS HOUSING

FIELD

The present invention relates to a housing for a spark plug, a spark plug including a housing, and a method for manufacturing the housing.

BACKGROUND INFORMATION

Present-day spark plugs include a housing made up of a steel, which is subject to a corrosion, in particular rusting, under the conditions prevailing in the engine. For this reason, the housing of the spark plug has been coated for some time now with a protective layer, which is to protect the steel housing against corrosion. Nickel-containing protective layers are very widespread. The corrosion protection of the nickel-containing protective layer is diminished by defects in the protective layer, however. These defects may extend from the surface of the nickel-containing protective layer up to the surface of the housing and, therefore, function as attack routes for corrosion at the housing itself.

For example, it is described in European Patent Application Nos. EP 2 546 938 A1 and EP 2 605 348 A1 that this problem may be minimized by applying a chromium-containing sealing layer onto the nickel-containing protective layer and, thereby, sealing the defects.

A chromium-containing sealing layer may be deposited, for example, from a CrVI-containing medium on the housing surface. In the process, a sealing layer including bound trivalent chromium arises. It may happen, however, that, depending on the surroundings conditions, trivalent chromium from the sealing layer surface, which is actually bound at the surface, transforms into free hexavalent chromium. The problem in this case is that hexavalent chromium is classified as harmful and its use is prohibited in some countries.

SUMMARY

An object of the present invention is to provide a housing for a spark plug including a corrosion-protection-layer system, which offers a good corrosion protection and, simultaneously, largely dispenses with the use of a chromium-containing sealing layer. In particular, the corrosion-protection-layer system should also have a temperature resistance at 300° C.

This object may be achieved by a housing for a spark plug according to example embodiments of the present invention in that the sealing layer situated onto a nickel-containing protective layer contains silicon. Due to the use of a silicon-containing sealing layer, the advantage results that a chromium-containing sealing layer may be dispensed with and, therefore, the risk that hexavalent chromium forms and leaves the sealing layer is prevented. Moreover, sealing layers based on silicon have proven to be highly temperature-resistant. Specifically, it has been shown, in series of tests for spark plug housings, which include a corrosion-protection-layer system made up of a nickel-containing protective layer and a silicon-containing sealing layer, that these housings still have a rust grade of 0 after 24 hours in a fog test, i.e., the housing exhibits no rusty spots in the areas of the housing at which a corrosion-protection layer has been applied. Even after outplacement of the housings at 300° C. for 3 hours, the housings still have a rust grade of 0 after 24 hours in a fog test.

The housing for a spark plug includes a bore along its longitudinal axis. Due to this bore, the housing obtains an outer side and an inner side. The bore in the housing is typically provided for accommodating an insulator including a center electrode and connectors. The housing is typically made up of a steel, such as carbon steel. On at least one portion of the outer side, a protective layer, which is to protect the housing against corrosion, is applied on the surface of the housing. The protective layer is a nickel-containing protective layer, which is applied onto the housing with the aid of electroplating or a chemical coating method.

In electroplating, the housing, as the anode, is dipped into a nickel-containing electrolyte bath together with an electrode functioning as a cathode. By applying a voltage between the housing and the electrode, a current flows from the electrode through the electrolyte toward the housing, as the result of which a nickel-containing protective layer is deposited on the side of the housing facing the electrode. The protective layer is essentially made up of nickel. Iron from the electrode is also deposited at the housing together with the nickel. The portion of iron in the nickel-containing protective layer is typically 2 weight percent to 6 weight percent. Further impurities in the nickel-containing protective layer, such as sulfur and traces of sodium or potassium, are possible.

In the chemical coating process, the housing is placed into a nickel-containing electrolyte bath and, due to the chemical oxidation reaction, the nickel deposits at the surface of the housing. Due to the chemical coating, a highly uniform nickel-containing protective layer is obtained on the housing. The protective layer is essentially made up of nickel. Phosphorous is admixed to the electrolyte and deposits at the housing surface together with the nickel. Phosphorous improves the corrosion protection function of the protective layer, although it also simultaneously makes the protective layer more brittle. A phosphorous content of 3 weight percent to 12 weight percent in the nickel-containing protective layer has proven to be a good compromise for a good corrosion protection property for the nickel-containing protective layer and, simultaneously, a sufficiently good processability of the nickel-containing protective layer.

The nickel-containing protective layer on the housing is utilized as passive corrosion protection, i.e., the nickel-containing protective layer is electrochemically more noble than the material of the housing and forms a barrier layer against moist media. The corrosion protection offered by the nickel-containing protective layer depends on layer thickness B of the nickel-containing protective layer and its freedom from defects. The thicker the nickel-containing protective layer is, the lesser the likelihood is that a defect extends from the surface of the nickel-containing protective layer through the entire thickness of the nickel-containing protective layer up to the surface of the housing and, as a result, opens up an attack route for corrosion processes at the housing. Due to an additional sealing layer on the nickel-containing protective layer, these defects are closed and the corrosion protection is improved.

Further advantageous embodiments of the present invention are described herein.

In one advantageous embodiment of the present invention, it is provided that the sealing layer is free of chromium, i.e., the sealing layer contains no intentionally added chromium and contains chromium, at most, in an amount of technically unavoidable impurities, for example, which are inadvertently intercalated into the sealing layer during the manufacturing process.

In one refinement of the present invention, a first intermediate layer is applied between the housing and the nickel-containing protective layer and/or a second intermediate layer is applied between the nickel-containing protective layer and the sealing layer and/or a cover layer is applied on the sealing layer.

Due to the first intermediate layer, the advantage results that the nickel-containing protective layer better adheres at the housing. The first intermediate layer is utilized as an adhesive bond layer and may be made up of, for example, copper or nickel strike.

Due to the second intermediate layer, the advantage results that the silicon-containing sealing layer better adheres at the nickel-containing protective layer and thermal stresses between the layers are reduced. The second intermediate layer is utilized as an adhesive bond layer and may contain, for example, at least one of the elements: nickel, copper, chromium, or titanium.

The cover layer on the silicon-containing sealing layer is utilized for protecting the sealing layer against mechanical damage and may contain, for example, at least one of the elements: nickel, copper, chromium, or titanium.

In addition, it has been found to be advantageous that the sealing layer has a layer thickness A of not less than 10 nm and not more than 10 μm, in particular not less than 100 nm and/or not more than 1 μm. It has been shown that the sealing layer should have a layer thickness A of not less than 10 nm, so that the sealing layer is sufficiently thick, in order to close the defects in the nickel-containing protective layer. Moreover, it has been shown that, in the case of layer thicknesses A of the sealing layer of more than 10 μm, there is no considerable improvement with respect to the above-described technical effects of the sealing layer.

Additionally or alternatively, layer thickness B of the nickel-containing protective layer is in a range from 1 μm to 30 μm.

Additionally or alternatively, the first intermediate layer has a layer thickness C from 1 nm to 1000 nm and/or the second intermediate layer has a layer thickness D from 1 nm to 1000 nm and/or the cover layer has a layer thickness E from 1 nm to 2000 nm. It is advantageous when the layer thickness of the intermediate layer and of the cover layer are considerably less thick than the nickel-containing protective layer; as a result, internal stresses are prevented from forming in the intermediate layers and the cover layer. Due to internal stresses in a layer, adhesive bond errors may occur or the layer may detach from another layer, such as the nickel-containing protective layer or the sealing layer.

The advantageous effects of the corrosion-protection-layer system, including the nickel-containing protective layer and the sealing layer as well as the optional first intermediate layer and/or the optional second intermediate layer and/or the optional cover layer, result, in particular, when the nickel-containing protective layer and the sealing layer, as well as the optional first intermediate layer and/or the optional second intermediate layer and/or the optional cover layer are formed on the entire outer side of the housing. And the corrosion-protection-layer system, in particular, are additionally also formed on at least a portion of the inner side of the housing. It is particularly advantageous when the nickel-containing protective layer and the sealing layer as well as the optional first intermediate layer and/or the optional second intermediate layer and/or the optional cover layer are formed on the entire surface of the housing. The more surface of the housing is covered by the corrosion-protection-layer system, the smaller is the exposed housing surface, which is susceptible to corrosion processes.

The present invention also relates to a spark plug including a housing according to an example embodiment of the present invention, an insulator located in the housing, a center electrode located in the insulator, and a ground electrode located at the combustion chamber-side end of the housing, the ground electrode and the center electrode being configured for jointly forming a spark gap.

Moreover, the present invention also relates to a method for manufacturing a housing according the present invention. In accordance with an example embodiment of the present invention, the manufacturing method includes the following steps:

providing a housing for a spark plug including a nickel-containing protective layer, which was applied onto the housing with the aid of an electroplating coating method or a chemical coating method, the housing optionally including a first intermediate layer and/or a second intermediate layer, thereafter, rinsing the housing coated with the nickel-containing protective layer, thereafter a step, in which a sealing layer is applied onto the nickel-containing protective layer or the second intermediate layer.

Optionally, the manufacturing method may also contain a cleaning step before the rinsing step, in which the surface of the housing coated with the nickel-containing protective layer is cleaned. The cleaning step is utilized for cleaning the surface of the housing and the surface of the nickel-containing protective layer of, for example, particles, dirt, and passivation agents and, in particular, carrying out a hydrolysis or activation of the surface for the bonding of the silane solution.

In the rinsing step, the housing coated with the nickel-containing protective layer is freed of the cleaning agent and its residue. Or, if a separate cleaning step is dispensed with, coarse contaminants, such as dust, are also washed off in the rinsing step.

In the step of applying the sealing layer, the sealing layer is applied at least onto the nickel-containing protective layer or onto the second intermediate layer.

Preferably, the sealing layer is a silicon-containing sealing layer, the silicon-containing sealing layer being formed by a silanization of the housing surface coated with the nickel-containing protective layer. A silanization is a chemical bonding of a silane compound at a surface. The bonding takes place via a condensation reaction between hydrolyzable groups of the utilized silanes and chemical groups at the surface. The silanes utilized for the silanization typically have the general form $R_mSiX_n$, R standing for organically functionalized residues and X standing for hydrolyzable groups, m and n stand for the number of the organically functionalized residues and the hydrolyzable groups.

In one advantageous refinement of the present invention, the method includes at least one drying step, in which the water or a solvent is removed from the surface of the coated and sealed housing. In the process, for example, the silane compounds already begin to cross-link. Moreover, the manufacturing method may also include a polycondensation step for curing the sealing layer. In the curing of silane compounds, the cross-linking of the silane compounds is concluded and solidifies, so that a solid and robust sealing layer forms.

Additionally or alternatively, the manufacturing method may include one more step, in which a cover layer is applied onto the sealing layer. As a result, the sealing layer is protected against mechanical damage.

In the preferred silanization, for example, the polycondensation may encompass that of silane compounds among one another, which are coupled at the surface of the nickel-containing protective layer of the housing, as well as that of silane compounds coupled onto the surface of the nickel-containing protective layer of the housing with silane compounds, which are not coupled thereon.

In principle, it is also possible that further silicone compounds, such as silicone oils (for example, diorgano polysiloxane), are intercalated into the network of the silane compounds, which have arisen due to the polycondensation.

In one advantageous refinement of the manufacturing method, a sol-gel process, CCVD, or PVD is utilized as the coating method for applying the sealing layer.

In the sol-gel process, the housing is placed into a silane solution. During the silanization, the silanes accumulate at the surface of the housing coated with the nickel-containing protective layer and, there, begin to cross-link with one another and form the sealing layer.

In the CCVD method (combustion chemical vapor deposition), also referred to as flame coating, a starting compound suitable for producing the desired layer, in this case the silanes, is added to a combustible gas. The flame is moved at a close distance over the substrate to be coated, in this case, the housing coated with the nickel-containing protective layer. Due to the high combustion energy, the starting compounds form highly reactive species, which fixedly bond with the substrate surface. The thermal load for the substrate itself is low, since it only briefly comes into contact with the flame.

In the PVD method (physical vapor deposition), the material to be deposited, in this case the silanes, is present in solid form in a coating chamber. The material is vaporized via bombardment with laser beams, ions, electrodes, or arc discharge. The vaporized material moves through the coating chamber toward the parts to be coated, in this case the housing coated with the nickel-containing protective layer, condenses there and, thereby, forms the layer.

It has been found to be advantageous for the manufacture of the silicon-containing sealing layer to utilize silanes with functionalization, in particular alkoxysilanes, aminosilanes, or acrylsilanes. Additionally, silanes without functionalization, in particular alkyl trialkoxysilanes, may also be utilized for the silane-containing sealing layer. Partially fluorinated or perfluorinated siloxanes are usable only to a limited extent, since layers formed therefrom do not have a temperature resistance up to 300° C.

Further features, possible applications, and advantages of the present invention result from the following description of exemplary embodiments of the present invention, which are represented in the figures.

DETAILED DESCRIPTION OF EXAMPLE EMBODIMENTS

Figure 1:
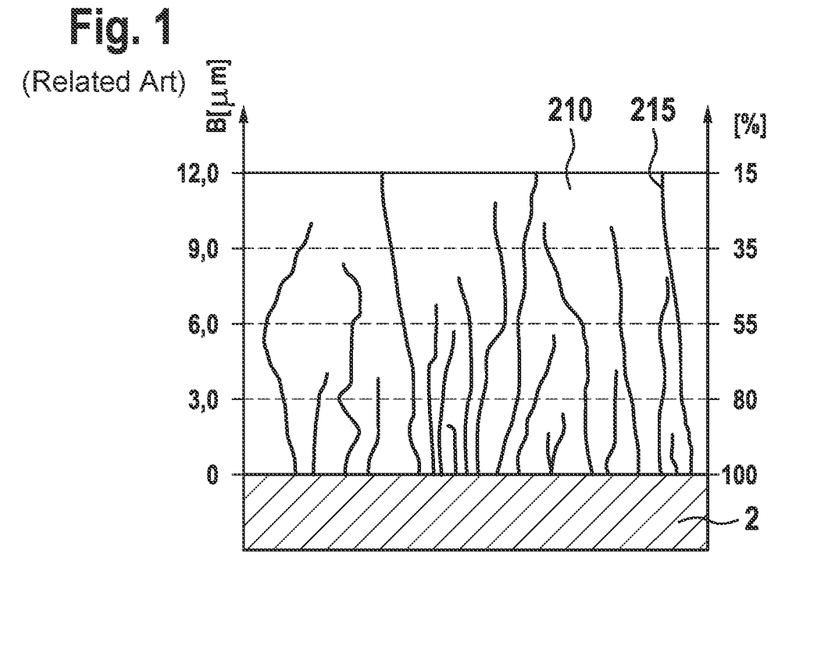
FIG. 1 shows an example of a nickel-containing protective layer on a housing according to the related art.

FIG. 1 shows an example of a nickel-containing protective layer 210 on a housing 2 according to the related art. Layer thickness B of nickel-containing protective layer 210 is plotted on the left side. The percentage of defects 215, which reach housing 2, is plotted on the right side. In this schematic representation, it is apparent that, as layer thickness B increases, the number of defects 215, which extend through entire nickel-containing protective layer 210 up to housing 2, decreases.

Figure 2A:
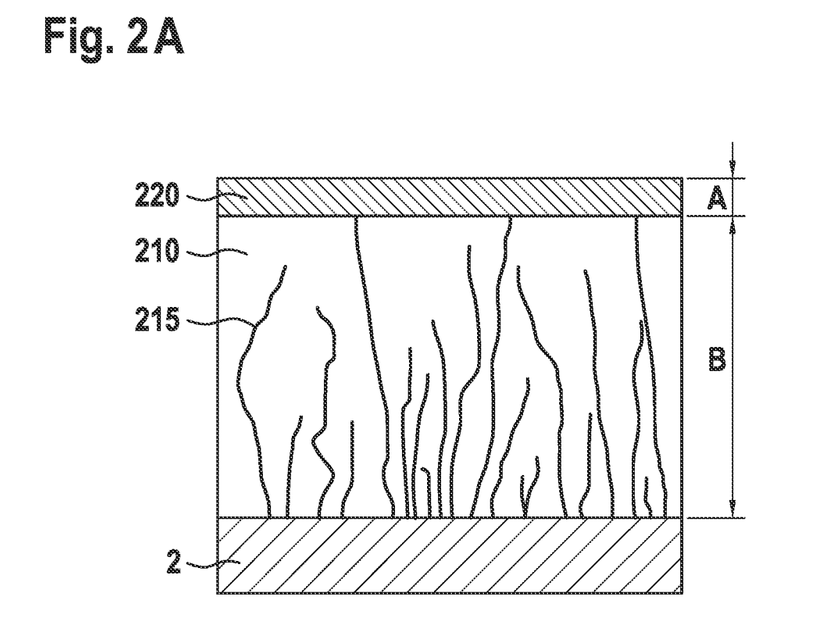
FIG. 2A shows an example of a corrosion-protection-layer system according to the present invention on a housing.

FIG. 2A shows an example of a corrosion-protection-layer system according to the present invention, made up of nickel-containing protective layer 210 and silicon-containing sealing layer 220. Nickel-containing protective layer 210 is applied on the surface of a housing 2. Silicon-containing sealing layer 220 is applied onto nickel-containing protective layer 210. Nickel-containing protective layer 210 has a layer thickness B. The layer thickness is measured perpendicularly to the housing surface. If nickel-containing protective layer 210 has been applied on housing 2 with the aid of electroplating, layer thickness B of nickel-containing protective layer 210 may be different at various points of housing 2. For example, housing 2 may include no nickel-containing protective layer 210 or only partially include a nickel-containing protective layer 210 on its inner side 204. Preferably, housing 2 includes a nickel-containing protective layer 210 on its entire outer side 205.

Silicon-containing sealing layer 220 has a layer thickness A. In the case of a silicon-containing sealing layer 220, which is applied with the aid of a dipping bath in a silane solution, a highly uniform layer thickness A generally results for silicon-containing sealing layer 220. In particular, silicon-containing sealing layer 220 may be formed on the entire surface of housing 2, also at points of housing 2 at which there is no nickel-containing protective layer 210, such as areas of inner side 204 of housing 2.

Figure 2B:
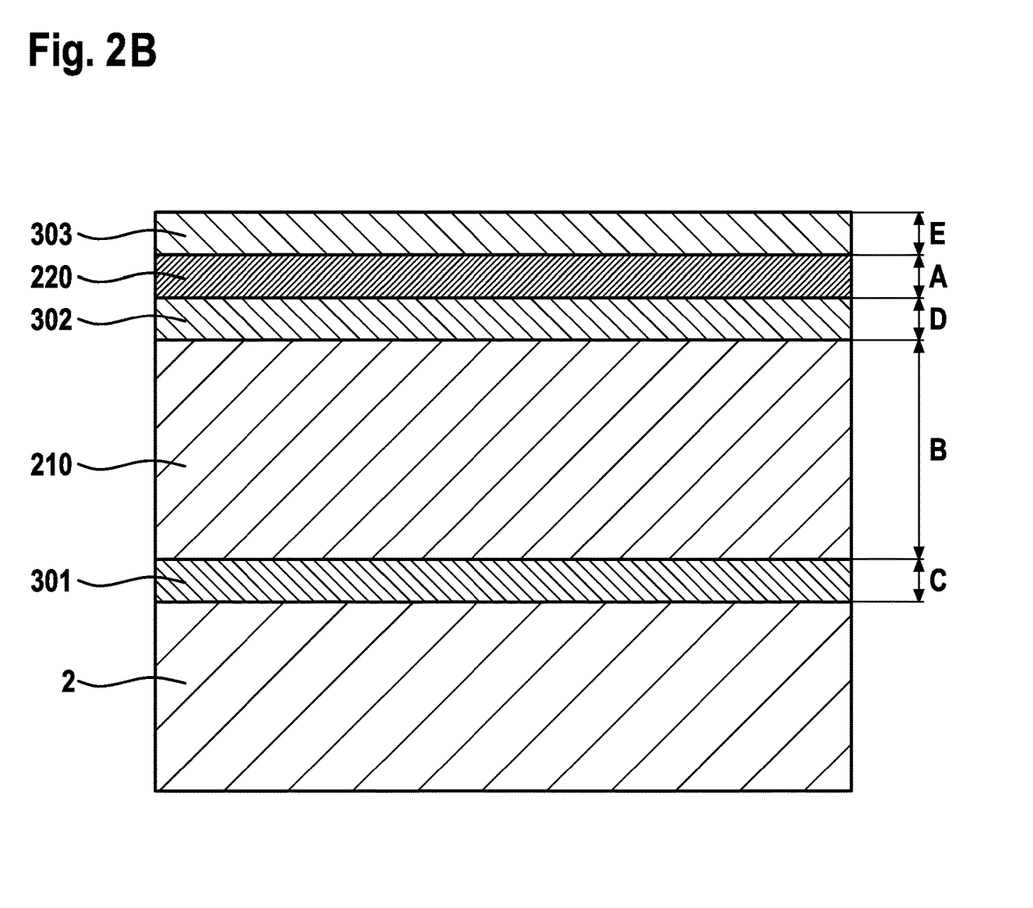
FIG. 2B shows a second example of a corrosion-protection-layer system according to the present invention on a housing.

FIG. 2B shows a second example of a corrosion-protection-layer system according to the present invention, made up of nickel-containing protective layer 210 and silicon-containing sealing layer 220 as well as first intermediate layer 301 and second intermediate layer 302 and cover layer 303. First intermediate layer 301 is applied on the surface of a housing 2. Nickel-containing protective layer 210 is in turn applied thereon. Second intermediate layer 302 is situated between nickel-containing protective layer 210 and silicon-containing sealing layer 220. Cover layer 303 is in turn applied on silicon-containing sealing layer 220. Nickel-containing protective layer 210 has a layer thickness B. First intermediate layer 301 has a layer thickness C and second intermediate layer 302 has a layer thickness D. The layer thicknesses are measured perpendicularly to the housing surface. If nickel-containing protective layer 210 has been applied on housing 2 with the aid of electroplating, layer thickness B of nickel-containing protective layer 210 may be different at various points of housing 2. For example, housing 2 may include no nickel-containing protective layer 210 or only partially include a nickel-containing protective layer 210 on its inner side 204. Silicon-containing sealing layer 220 has a layer thickness A. In the case of a silicon-containing sealing layer 220, which is applied with the aid of a dipping bath in a silane solution, a highly uniform layer thickness A generally results for silicon-containing sealing layer 220. In particular, silicon-containing sealing layer 220 may be formed on the entire surface of housing 2, also at points of housing 2 at which there is no nickel-containing protective layer 210, such as areas of inner side 204 of housing 2. Cover layer 303 has a layer thickness E.

In further embodiments of housing 2 including the corrosion-protection-layer system according to the present invention, the corrosion-protection-layer system may include, alongside nickel-containing protective layer 210 and sealing layer 220, only cover layer 303 or only first intermediate layer 301 or second intermediate layer 302 or cover layer 303 in combination with first intermediate layer 301 or second intermediate layer 302.

Figure 3:
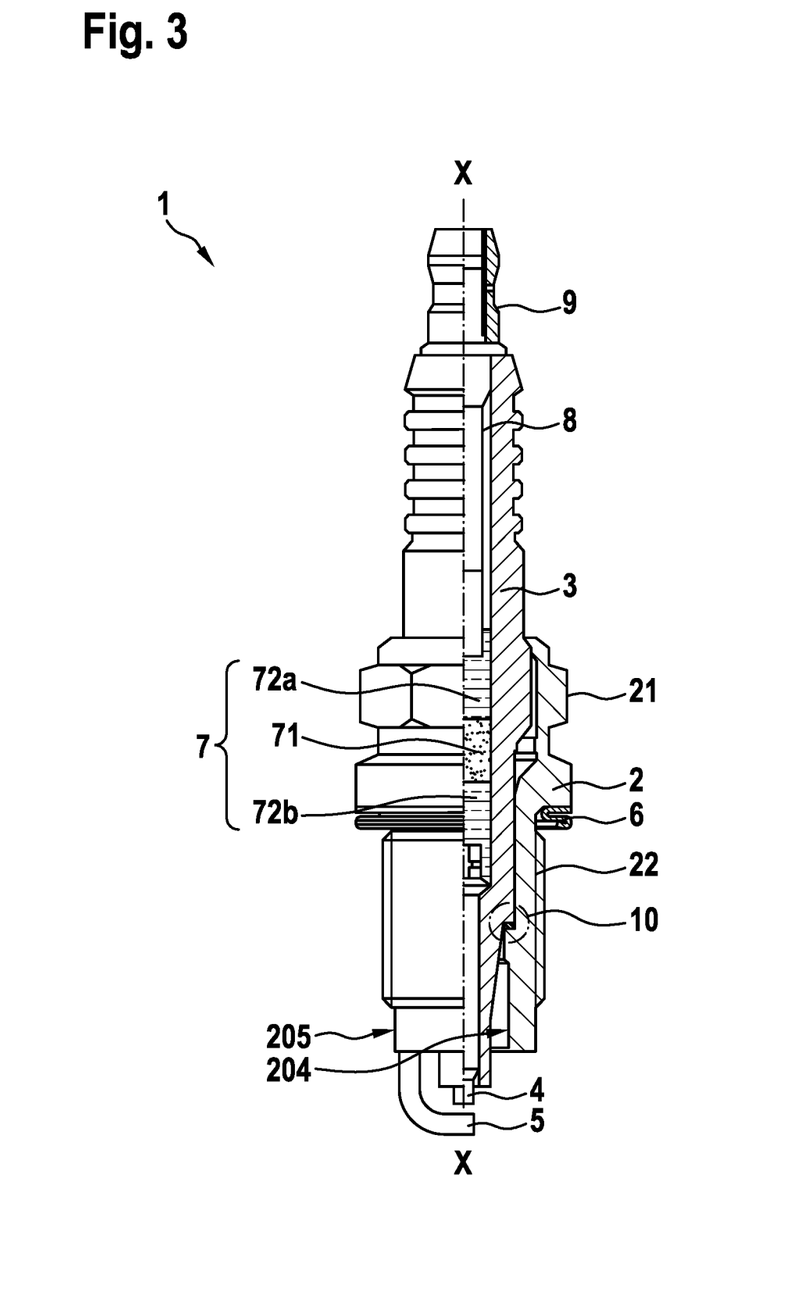
FIG. 3 shows an example of a spark plug including the housing according to the present invention.

FIG. 3 shows a spark plug 1 in a bisected view. Spark plug 1 includes a housing 2. An insulator 3 is inserted into housing 2. Housing 2 and insulator 3 each include a bore along its longitudinal axis X. Due to the bore, housing 2 includes an outer side 205 and an inner side 204. The longitudinal axis of housing 2, the longitudinal axis of insulator 3, and the longitudinal axis of spark plug 1 coincide. A center electrode 4 is inserted into insulator 3. Moreover, a terminal stud 8 extends into insulator 3. A terminal nut 9 is situated at terminal stud 8, via which spark plug 1 is electrically contactable to a voltage source (not represented here). Terminal nut 9 forms the end of spark plug 1 facing away from the combustion chamber.

A resistor element 7, also referred to as CCM (ceramic compound material), is located in insulator 3 between center electrode 4 and terminal stud 8. Resistor element 7 connects center electrode 4 to terminal stud 8 in an electrically conductive manner. Resistor element 7 is designed, for example, as a layer system made up of a first contact CCM 72a, a resistor CCM 71, and a second contact CCM 72b. The layers of resistor element 7 differ with respect to their material composition and the resultant electrical resistance. First contact CCM 72a and second contact CCM 72b may have a different electrical resistance or an identical electrical resistance. Resistor element 7 may also include only one layer of resistor CCM or multiple various layers of resistor CCM having different material compositions and resistances.

Insulator 3 rests via one shoulder on a housing seat formed at the housing inner side. In order to seal the air gap between the housing inner side and insulator 3, an inner seal 10 is situated between the insulator shoulder and the housing seat, which is plastically deformed when insulator 3 is clamped in housing 2.

A ground electrode 5 is electrically conductively situated at housing 2 on its combustion chamber-side end face. Ground electrode 5 and center electrode 4 are situated with respect to one another in such a way that a spark gap forms between them, at which the ignition spark is generated.

Housing 2 includes a shaft. A polygon 21, a shrink recess, and a thread 22 are formed on this shaft. Thread 22 is utilized for screwing spark plug 1 into an internal combustion engine. An outer sealing element 6 is situated between thread 22 and polygon 21. Outer sealing element 6 is designed as a folded-wall seal ring in this exemplary embodiment.

Housing 2 is made up of a steel, for example carbon steel. A nickel-containing protective layer 210 is applied on housing 2, in particular on its outer side. Nickel-containing protective layer 210 has a layer thickness B, B preferably being not less than 1 μm and not greater than 30 μm. Nickel-containing protective layer 210 is utilized as passive corrosion protection. A silicon-containing sealing layer 220 is also applied on nickel-containing protective layer 210. Silicon-containing sealing layer 220 has a layer thickness A, A preferably being not less than 10 nm and not greater than 1000 nm.

Figure 4:
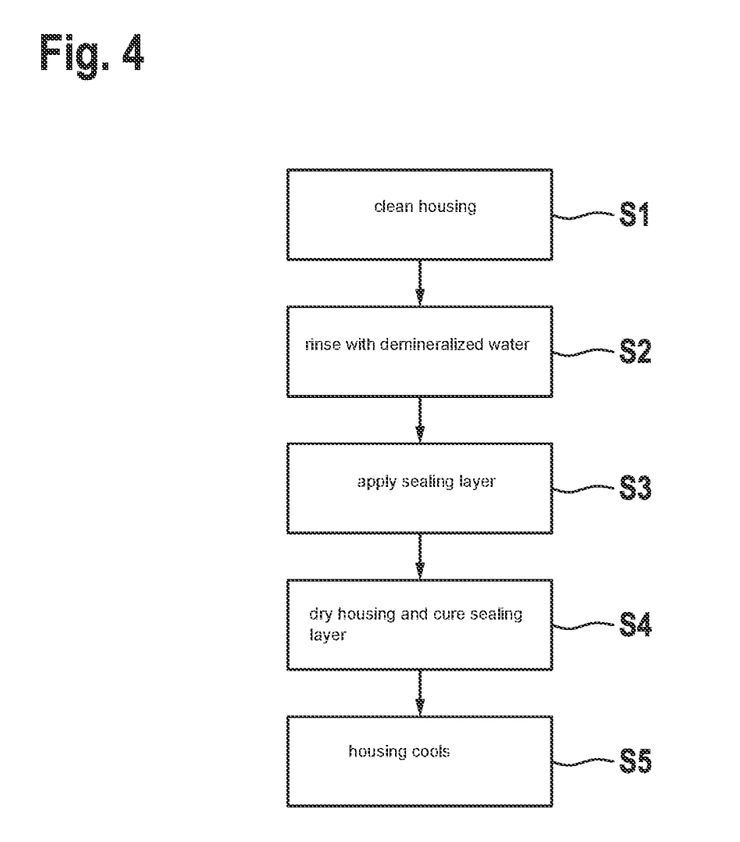
FIG. 4 shows, by way of example, the method for manufacturing a housing according to the present invention.

FIG. 4 schematically shows a section of the exemplary sequence of the method for manufacturing a housing 2 according to the present invention.

In a first optional step S1, housing 2, which was previously coated with a nickel-containing protective layer 210 with the aid of electroplating or a chemical coating method, and its surface are cleaned. For this purpose, housing 2 coated with nickel-containing protective layer 210 is placed into a bath with a high alkaline cleaning agent and is additionally irradiated with ultrasound in the bath for approximately 5 minutes. The optional cleaning step is utilized, on the one hand, for removing particles, dirt, and passivation agents, which obstruct an application of sealing layer 220; on the other hand, the surface, onto which sealing layer 220 is to be applied, is hydrolyzed and activated, so that sealing layer 220 has a good bonding possibility. Optionally, before the optional cleaning, housing 2 may also include, alongside nickel-containing protective layer 210, a first intermediate layer 301 and/or a second intermediate layer 302.

In second step S2, cleaned housing 2 is rinsed with, for example, demineralized water, so that possible residue of cleaning agents is removed.

In third step S3, sealing layer 220 is applied. The application may take place, for example, via a silanization of housing 2. In this case, housing 2 is dipped into a silane solution or is sprayed with a silane solution. In this step, the silane bonds to the hydrolyzed surface of housing 2 and begins to cross-link, thereby creating sealing layer 220.

In optional fourth step S4, a drying of housing 2 and the curing of sealing layer 220 take place. After the silanization, housing 2 is placed, for example, into a drying oven at approximately 130° C. for approximately 15 minutes. Possible water residue or solvent residue, for example from the bath, is removed from sealing layer 220. Simultaneously, the cross-linking of the silanes with one another is concluded, as the result of which sealing layer 220 cures. The drying step is particularly advantageous, since, as a result, the cross-linking of the silanes with one another is supported and accelerated.

In final step S5 shown here, housing 2 cools down before it is forwarded for further processing, such as an application of a cover layer 303 onto silicon-containing sealing layer 220 or an assembly of spark plug 1.

What is claimed is:

1. A spark plug, comprising:
    a housing including a bore along a longitudinal axis of the housing, as a result of which the housing has an outer side and an inner side, an electroplated or chemically applied nickel-containing protective layer situated on at least one portion of the outer side of the housing, and a sealing layer situated on the nickel-containing protective layer, wherein the sealing layer contains silicon;
    an insulator situated in the housing;
    a center electrode situated in the insulator; and
    a ground electrode situated at the combustion chamber-side end of the housing, the ground electrode and the center electrode being configured for jointly forming a spark gap, wherein the sealing layer contains silicon, wherein the sealing layer is made by silanization of a surface of the housing, which is covered by the nickel-containing protective layer.

2. A housing for a spark plug, comprising:
a bore along a longitudinal axis of the housing, as a result of which the housing has an outer side and an inner side;
an electroplated or chemically applied nickel-containing protective layer situated on at least one portion of the outer side of the housing; and
a sealing layer situated on the nickel-containing protective layer, wherein the sealing layer contains silicon,
wherein the sealing layer contains silicon, wherein the sealing layer is made by silanization of a surface of the housing, which is covered by the nickel-containing protective layer.

3. The housing as recited in claim 2, wherein the sealing layer is free of chromium.

4. The housing as recited in claim 2, wherein at least one of: (i) a first intermediate layer is situated between the housing and the nickel-containing protective layer, (ii) a second intermediate layer is situated between the nickel-containing protective layer and the sealing layer, or (iii) a cover layer is situated on the sealing layer.

5. The housing as recited in claim 4, wherein at least one of the first intermediate layer has a layer thickness of 1 nm to 1000 nm, (ii) the second intermediate layer has a layer thickness of 1 nm to 1000 nm, or (iii) the cover layer has a layer thickness of 1 nm to 2000 nm.

6. The housing as recited in claim 4, wherein the nickel-containing protective layer and the sealing layer, and at least one of: (i) the first intermediate layer, (ii) the second intermediate layer, or (iii) the cover layer, are formed on an entire outer side of the housing and on at least one portion of the inner side of the housing.

7. The housing as recited in claim 2, wherein the sealing layer has a layer thickness of 10 nm to 10 µm.

8. The housing as recited in claim 2, wherein the sealing layer has a layer thickness of 100 nm to 1 µm.

9. The housing as recited in claim 2, wherein the nickel-containing protective layer has a layer thickness of 1 µm to 30 µm on the housing.

10. A method for manufacturing a housing, comprising the following steps:
providing a housing for a spark plug including a nickel-containing protective layer, which was applied onto the housing using an electroplating coating method or a chemical coating method;
after the providing, rinsing the housing coated with the nickel-containing protective layer; and
after the rinsing, applying a sealing layer onto the nickel-containing protective layer,
wherein the sealing layer contains silicon, wherein the sealing layer is made by silanization of a surface of the housing, which is covered by the nickel-containing protective layer.

11. The method as recited in claim 10, wherein the housing includes an intermediate layer suited on the nickel-containing protective layer, wherein in the applying step, the sealing layer is applied onto the intermediate layer.

12. The method as recited in claim 10, further comprising:
before the rinsing step, cleaning the surface of the housing coated with the nickel-containing protective layer.

13. The method as recited in claim 10, further comprising:
after the applying of the sealing layer onto the nickel-containing protective layer, drying the housing to remove possible water or solvent from the application of the sealing layer from the surface of the housing.

14. The method as recited in claim 13, wherein after the drying step, a polycondensation step occurs, in which the sealing layer cures.

15. The method as recited in claim 10, further comprising:
applying a cover layer onto the sealing layer.

16. The method as recited in claim 10, wherein a sol-gel process, or CCVD, or PVD is utilized as a coating method for the applying of the sealing layer.

17. The method as recited in claim 10, wherein silanes with functionalization including alkoxysilanes, or aminosilanes, or acrylsilanes, are utilized for the sealing layer.

18. The method as recited in claim 17, wherein, additionally, silanes without functionalization, including alkyl tri-alkoxysilanes, are also utilized for the sealing layer.

* * * * *